United States Patent [19]

Ohnaka et al.

[11] Patent Number: 5,144,633
[45] Date of Patent: Sep. 1, 1992

[54] SEMICONDUCTOR LASER AND MANUFACTURING METHOD THEREOF

[75] Inventors: Kiyoshi Ohnaka, Moriguchi; Yuzaburo Ban, Osaka; Isao Kidoguchi, Kadoma, all of Japan

[73] Assignee: Matsushita Electric Industrial Co., Ltd., Kadoma, Japan

[21] Appl. No.: 704,969

[22] Filed: May 23, 1991

[30] Foreign Application Priority Data

May 24, 1990 [JP] Japan .................. 2-135067

[51] Int. Cl.$^5$ .............................. H01S 3/19
[52] U.S. Cl. ................................. 372/45
[58] Field of Search ............... 372/44, 45, 46, 47, 372/48

[56] References Cited

U.S. PATENT DOCUMENTS

| | | | |
|---|---|---|---|
| 5,034,957 | 7/1991 | Ohba et al. | 372/45 |
| 5,036,521 | 7/1991 | Hatakoshi et al. | 372/45 |
| 5,058,120 | 10/1991 | Nitta et al. | 372/45 |

Primary Examiner—John D. Lee
Assistant Examiner—Robert E. Wise
Attorney, Agent, or Firm—Wenderoth, Lind & Ponack

[57] ABSTRACT

A hetero structure semiconductor laser of inner stripe type comprises an $(Al_xGa_{1-x})_{0.5}In_{0.5}P$ first cladding layer of a first conductivity type, a $Ga_{0.5}In_{0.5}P$ or $(Al_xGa_{1-x})_{0.5}In_{0.5}P$ active layer, an $(Al_xGa_{1-x})_{0.5}In_{0.5}P$ second cladding layer of a second conductivity type different from the first conductivity type, an AlInP or $(Al_xGa_{1-x})_{0.5}In_{0.5}P$ confinement layer or a $SiO_2$ having a stripe-like opening and having a refractive index lower than that of the first cladding layer, and an upper cladding layer having a band gap larger than that of the first cladding layer having a refractive index lower than that of the second cladding layer are formed successively on a GaAs substrate. Further, the width of the active layer may be narrowed as a stripe-like structure. Thus, astigmatism of a semiconductor laser becomes smaller and the threshold value of laser action becomes smaller. The manufacturing methods of such a semiconductor laser are also disclosed.

24 Claims, 5 Drawing Sheets

SEMICONDUCTOR LASER AND MANUFACTURING METHOD THEREOF

BACKGROUND OF THE INVENTION

The present invention relates to a semiconductor laser including $(Al_xGa_{1-x})_{0.5}In_{0.5}P$ or the like wherein the transverse mode is controlled and a manufacturing method thereof.

A semiconductor laser which can emit visible light at a wavelength of 700 nm or less has attracted attention as a light source to be used for an optical disc, a laser printer, a bar code scanner or the like. Among them, a double heterostructure semiconductor laser comprising a GaAs substrate, a $Ga_{0.5}In_{0.5}P$ or $(Al_xGa_{1-x})_{0.5}In_{0.5}P$ active layer and $(Al_xGa_{1-x})_{0.5}In_{0.5}P$ or $Al_yGa_{1-y}As$ cladding layers each making lattice match with adjacent layers is promising as a red-color semiconductor laser material because it can emit light of the shortest wavelength among III–V compound semiconductors which makes lattice match with GaAs.

An inner stripe geometry has been used to restrict the spreading of carriers in the lateral directions and to confine electric current. FIG. 1 shows an example of a semiconductor laser of double heterostructure of inner stripe type, wherein an n-type $(Al_xGa_{1-x})_{0.5}In_{0.5}P$ cladding layer 2, a $Ga_{0.5}In_{0.5}P$ active layer 3, a p-type $(Al_xGa_{1-x})_{0.5}In_{0.5}P$ cladding layer 4 and a p-type $Ga_{0.5}In_{0.5}P$ etch stop layer 5 are applied successively to an n-type GaAs substrate 1. Then, an n-type GaAs blocking layer 6 having a stripe-like opening is applied to the etch stop layer 5, and a p-type GaAs cap layer 7 is applied to the blocking layer 6 and the etch stop layer 5. Ohmic contact electrodes 11 and 12 are applied to the cap layer 10 and the substrate 1, respectively. The conductivity type of the layers 1, 2, 4, 5, 6 can be changed to the other type.

In an inner stripe type semiconductor laser explained above, the blocking layer plays a role to confine current. Therefore, the laser action can take place at a low threshold current.

Though the current is confined in an inner stripe type semiconductor laser as explained above, the blocking layer 6 and the cap layer 8 absorb light generated in the active layer 3. Therefore, it is a problem that if the thickness of the cladding layer 4 between the active layer and the cap layer is decreased in order to confine the current more, the light generated in the active layer is absorbed more in the blocking layer and the cap layer. Thus, a part of the light guided in the active layer is lost and the threshold current is increased due to the loss.

It is another problem that the wave front of the guided wave is distorted in a direction parallel to the active layer because the semiconductor laser is a gain guide type. Therefore, astigmatism as large as about forty micrometers arises so that the laser beam cannot be made parallel or focussed into a point with use of a conventional convex lens. Thus, the range of application to optical devices of an inner stripe type semiconductor laser is limited.

SUMMARY OF THE INVENTION

It is an object of the present invention to provide an inner stripe type semiconductor laser wherein laser action can take place at a low threshold current.

It is another object of the present invention to provide an inner stripe type semiconductor laser which has a small astigmatism.

It is a further object of the present invention to provide a method for manufacturing a semiconductor laser which can take laser action at a low threshold current or have a small astigmatism.

A first semiconductor laser according to the present invention comprises: a GaAs substrate of a first conductivity type; a first $(Al_xGa_{1-x})_{0.5}In_{0.5}P$ cladding layer of the first conductivity type applied to the GaAs substrate; an active layer applied to the $(Al_xGa_{1-x})_{0.5}In_{0.5}P$ cladding layer; a second $(Al_xGa_{1-x})_{0.5}In_{0.5}P$ cladding layer of a second conductivity type different from that of the first conductivity type, which second cladding layer being applied to the active layer; a confinement layer having a stripe-like opening, which confinement layer having a refractive index lower than that of the second $(Al_xGa_{1-x})_{0.5}In_{0.5}P$ cladding layer, which confinement layer being applied to the second $(Al_xGa_{1-x})_{0.5}In_{0.5}P$ cladding layer; and an upper cladding layer of the second conductivity type, which upper cladding layer having a band gap larger than that of the second cladding layer and having a refractive index lower that that of the second cladding layer, which upper cladding layer being applied to the confinement layer and the second $(Al_xGa_{1-x})_{0.5}In_{0.5}P$ cladding layer.

The confinement layer may be replaced by two insulator layers having a refractive index lower than that of the cladding layer, which insulator layers being applied to the second cladding layer and the confinement layer, which two insulator layers being arranged to form a stripe-like gap.

A second semiconductor laser according to the present invention has a structure similar to that of the above-mentioned first semiconductor laser except that comprising a stripe-like active layer applied to the $(Al_xGa_{1-x})_{0.5}In_{0.5}P$ cladding layer and a disordered layer applied to the $(Al_xGa_{1-x})_{0.5}In_{0.5}P$ cladding layer arranged adjacent to the stripe-like active layer.

In a method of manufacturing the second semiconductor laser the confinement layer includes impurities, which are diffused to the active layer to make it disordered when heat is added to them on the processes for forming the upper cladding layer and/or the cap layer.

It is an advantage of a semiconductor laser according to the present invention that current can be confined effectively so that laser action takes place at a lower threshold current and astigmatism becomes smaller.

BRIEF EXPLANATION OF THE DRAWINGS

Further objects and advantages of the present invention will be apparent from the following description, reference being had to the accompanying drawings wherein preferred embodiments of the present invention are clearly shown.

In the drawings.

EMBODIMENTS

Embodiments of the present inventions will be explained below with reference to the drawings wherein the same numerals designate the same or like parts throughout the views.

Figure 1:
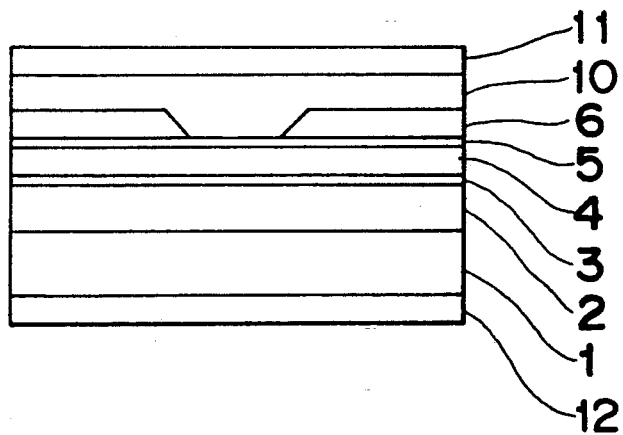
FIG. 1 is a schematic sectional view of a prior art semiconductor laser of lateral mode control type.
Figure 2:
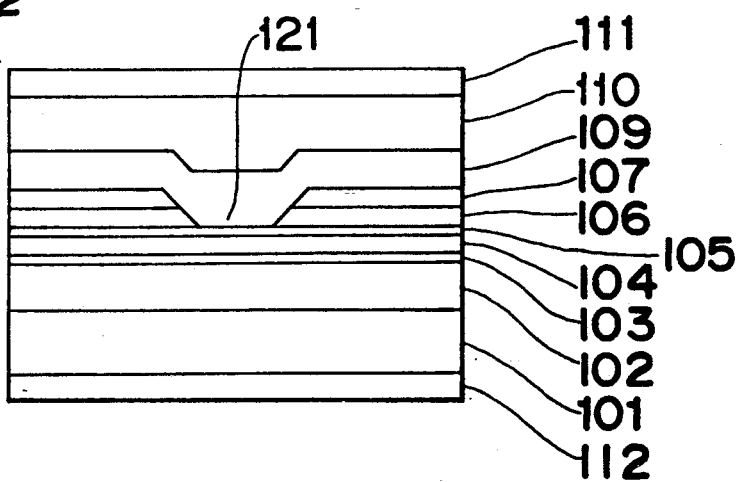
FIG. 2 is a schematic sectional view of a semiconductor laser of a first embodiment.

FIG. 2 shows a schematic sectional view of a semiconductor laser of a first embodiment, wherein an n-type cladding layer 102, an active layer 103, a p-type cladding layer 104 and a p-type etch stop layer 105 are applied successively to an n-type substrate 101. Further, a p-type confinement layer 106 and an n-type blocking layer 107 are applied to the etch stop layer 105, successively. A stripe-like opening 121 for confining current is formed through the confinement layer 106 and the blocking layer 107 up to the surface of the etch stop layer 105. Then, a p-type upper cladding layer 109 and a p-type cap layer 110 are applied successively to the blocking layer 107, the confinement layer 106 and the etch stop layer 105. Further, an electrode 111 is applied to the cap layer 110, while another electrode 112 is applied to the substrate 101.

The substrate 101 is made of n-type GaAs having a (100) principal plane. The n-type cladding layer 102 is made for example of $(Al_xGa_{1-x})_{0.5}In_{0.5}P$ (hereinafter referred to also as AlGaInP) of $0<x<1$, preferably $x=0.6$ of carrier concentration of $7*10^{17}$ cm$^{-3}$ of 1 micrometer thickness. The active layer 103 is made for example of $Ga_{0.5}In_{0.5}P$ (hereinafter referred to also as GaInP) of thickness of for example 0.08 micrometer. The p-type cladding layer 104 is made for example of $(Al_xGa_{1-x})_{0.5}In_{0.5}P$ of $0<x<1$, preferably $x=0.6$ of carrier concentration of $4*10^{17}$ cm$^{-3}$ of thickness 0.1 micrometer. The p-type etch stop layer 105 is made for example of $Ga_{0.5}In_{0.5}P$ of carrier concentration of $1*10^{18}$ cm$^{-3}$ of 0.01 micrometer thickness. The p-type confinement layer 106 is made for example of $Al_{0.5}In_{0.5}P$ (hereinafter referred to also as AlInP) of carrier concentration of $4*10^{17}$ cm$^{-3}$ of 0.3 micrometer. The p-type blocking layer 107 is made for example of GaAs of carrier concentration of $1*10^{18}$ cm$^{-3}$ of 0.5 micrometer thickness. The p-type upper cladding layer 109 is made for example of $Al_yGa_{1-y}As$ (hereinafter referred to also as AlGaAs) of $0<y<1$ preferably $y=0.7$ of carrier concentration $1*10$cm$^{-3}$ of 0.5 micrometer thickness. The p-type cap layer 110 is made for example of GaAs of carrier concentration of $5*10^{18 \, 18 \, cm-3}$ of 3 micrometer thickness. The p-type ohmic contact electrode 111 is made of Cr/Au, while the n-type ohmic contact electrode 112 is made of Au/Ge/Ni.

A characteristic of this embodiment is that because the p-type AlInP confinement layer 106 having a refractive index lower than that of the p-type $(Al_xGa_{1-x})_{0.5}In_{0.5}P$ 102 is formed at the two sides of the stripe, light can be confined and guided in a direction parallel to the active layer 103, so that light can be guided according to refractive index in both directions parallel and vertical to the active layer 103. Therefore, astigmatism can be made much smaller than that of prior arts.

For example, in the above-mentioned embodiment, the astigmatism is as small as three micrometers.

Another characteristic is that the p-type AlInP confinement layer 106 having a refractive index lower than that of the p-type $(Al_xGa_{1-x})_{0.5}In_{0.5}P$ cladding layer 102 is formed at both sides of the stripe will not absorb light generated in the active layer 103. Therefore, the thickness of the cladding layer 104 can be made thinner while the loss of light becomes smaller and the threshold value of laser action becomes much smaller than that of prior arts. For example, in the above-mentioned example, the threshold value is as small as 20 mA.

A further characteristic is that it is also possible to make the stripe width narrower because the p-type AlInP confinement layer 106 does not absorb light. For example, if the stripe width is 2.5 micrometers or less in the above-mentioned embodiment, the light radiation angle $\theta\|$ in a direction parallel to the active layer 103 can be increased up to 11° larger than a prior art value 8°, while the light radiation angle $\theta\bot$ in a direction perpendicular to the active layer 103 is 36°, so that the aspect ratio $\theta\bot/\theta\|$ can be decreased to 3.3 smaller that a prior art value 4.6, so as to make the shape toward to a circle.

It is to be noted that if the conductivity type of the AlInP confinement layer 106 can be changed to n-type, characteristics similar to those of the above-mentioned example can also be obtained. Further, it is also to be noted that characteristics similar to those of the above-mentioned example can be obtained if a p-type or n-type $(Al_xGa_{1-x})_{0.5}In_{0.5}P$ confinement layer having a refractive index lower than that of the p-type $(Al_xGa_{1-x})_{0.5}In_{0.5}P$ cladding layer 102 can be replaced with the p-type AlInP confinement layer 106.

It is also to be noted that if the conductivity type of the GaAs blocking layer 107 above the p-type AlInP confinement layer 106 is changed to p-type, the current can also be blocked and can be confined because the discontinuity of bands which exists at the heterojunction between the p-type AlInP confinement layer 106 and the p-type GaAs blocking layer becomes a barrier for holes.

Figure 3A:
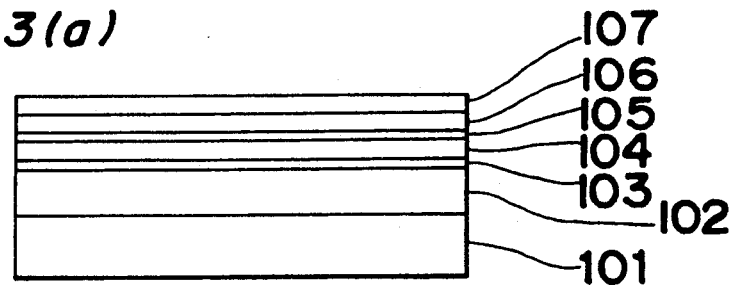
FIGS. 3(a)–(c) are schematic views for illustrating steps of a method of manufacturing a semiconductor method of the first embodiment.
Figure 3B:
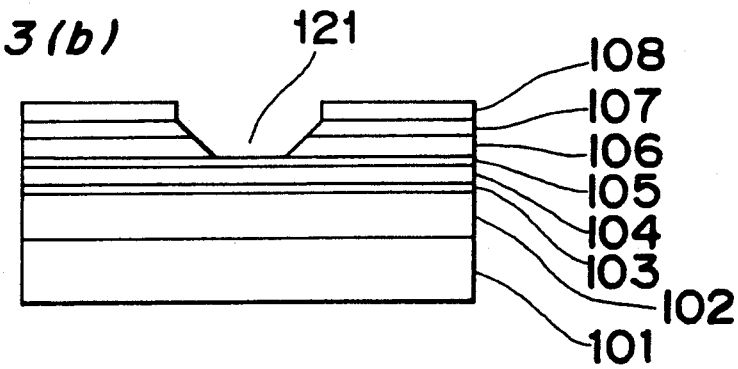
Figure 3C:
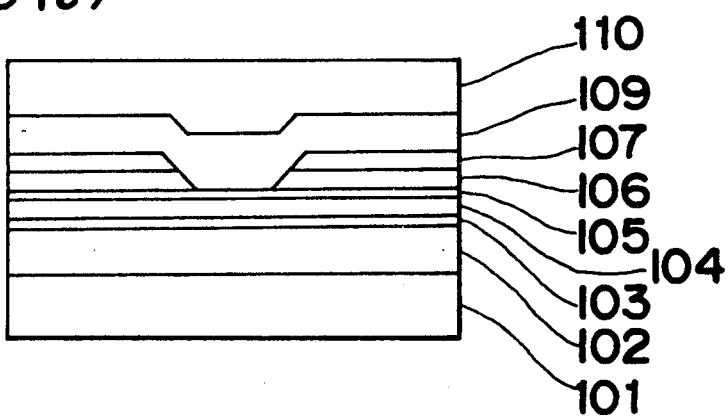

FIGS. 3(a)-(c) show steps of manufacturing a semiconductor laser illustrated in FIG. 2. First, as shown in FIG. 3(a), following layers 102, 103, 104, 105, 106 and 107 are grown successively on the (100) plane of the p-type GaAs substrate 101 with phase match with use of metal-organic vapor phase epitaxy (MO-VPE) process: the n-type first cladding layer 102 of $(Al_xGa_{1-x})_{0.5}In_{0.5}P$ ($x=0.6$ of carrier concentration of $7*10^{17}$ cm$^{-3}$ of 1 micrometer thickness), the $Ga_{0.5}In0.5P$ active layer 103 (thickness of 0.08 micrometer), the p-type cladding layer 104 of $(Al_xGa_{1-x})_{0.5}In_{0.5}P$ ($x=0.6$ of carrier concentration of $4*10^{17}$ cm$^{-3}$ of thickness 0.1 micrometer), the p-type $Ga_{0.5}In_{0.5}P$ etch stop layer 105 (carrier concentration of $1*10^{18}$ cm$^{-3}$ of 0.01 micrometer thickness), the p-type AlInP confinement layer 106 (carrier concentration of $4*10^{17}$ cm$^{-3}$ of 0.3 micrometer), and the n-type GaAs blocking layer 107 (carrier concentration of $1*10^{18}$ cm$^{-3}$ of 0.5 micrometer thickness). Next, after an SiO$_2$ film 108 is applied to the n-type GaAs blocking layer 107, a stripe-like opening of for example three micrometer width is formed for a mask for photolithography process. Then, by using the mask, the n-type GaAs blocking layer 107 is etched for example with a mixture solution of $H_2SO_4:H_2O_2:H_2O=1:1:10$, and further by using a mask of the n-type GaAs blocking layer 107, the p-type AlInP etch stop layer 106 is etched to the p-type $Ga_{0.5}In_{0.5}P$ etch stop layer 104 for example with hot concentrated sulfuric acid at 30° C., thus forming an opening 121 as shown in FIG. 3(b). If the stripe-like opening 121 is formed for example in <011>direction, the p-type AlInP confinement layer 106 and the n-type GaAs blocking layer 107 are etched with tapering at both sides of the opening 151. Then, after the $SiO_2$ 108 is removed, as shown in FIG. 3(c), the p-type upper cladding layer 109 of $Al_yGa_{1-y}As$ (y=0.7 of carrier concentration $1*10^{18}$ cm$^{-3}$ of 0.5 micrometer thickness) and the p-type GaAs cap layer 110 (carrier concentration of $5*10^{18}$ cm$^{-3}$ of 3 micrometer thickness) are applied successively over the whole surface with the MO-VPE process. Finally, the p-type ohmic contact electrode 111 made of Cr/Au is formed on the surface, while the n-type ohmic contact electrode 112 made of Au/Ge/Ni is formed on the rear surface. Thus, the semiconductor laser shown in FIG. 2 is completed.

It is an advantage of the above-mentioned manufacturing method of a semiconductor laser that the p-type AlInP confinement layer 106 can easily be etched selectively by using the n-type GaAs blocking layer 107 as a mask.

It is another advantage that a good quality of the $Al_yGa_{1-y}As$ p-type upper cladding layer 109 of good crystalline property can be grown because the surface of the AlInP confinement layer 106 including aluminum being liable to be oxidized easily has been covered with the n-type blocking layer 107.

Figure 4:
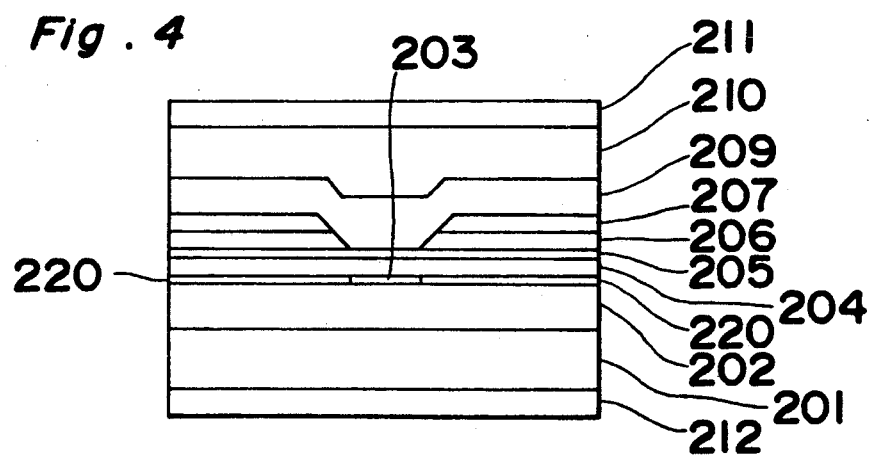
FIG. 4 is a schematic sectional view of a semiconductor laser of a second embodiment.

FIG. 4 shows schematically a structure of a semiconductor laser of a second embodiment, wherein an n-type cladding layer 202 is applied to an n-type substrate 201. Then, an active layer 203 and disordered layers 220 arranged adjacent to the active layer 203 at both sides are applied to the cladding layer 202. Further, a p-type cladding layer 204 and a p-type etch stop layer 205 are applied to the active layer 203 and the disordered layers 220. Further, a p-type confinement layer 206 and an n-type blocking layer 207 are applied to the etch stop layer 205, successively. An opening 221 for confining current is formed through the confinement layer 206 and the blocking layer 207. Then, a p-type upper cladding layer 209 and a p-type cap layer 210 are applied successively to the blocking layer 207, the confinement layer 206 and the etch stop layer 205. Further, an electrode 211 is applied to the cap layer 210, while an electrode 212 is applied to the substrate 201. This structure is different from that of the first embodiment shown in FIG. 2 mainly on the width of the active layer.

The substrate 201 is made of n-type GaAs having a (100) principal plane. The n-type cladding layer 202 is made for example of $(Al_xGa_{1-x})_{0.5}In_{0.5}P$ of $0<x<1$, preferably x=0.6 of carrier concentration of $7*10^{17}$ cm$^{-3}$ of 1 micrometer thickness. The active layer 203 is made for example of $Ga_{0.5}In_{0.5}P$ of thickness of for example 0.08 micrometer. The p-type cladding layer 204 is made for example of $(Al_xGa_{1-x})_{0.5}In_{0.5}P$ of x=0.6 of carrier concentration of $4*10^{17}$ cm$^{-3}$ of thickness 0.1 micrometer. The p-type etch stop layer 205 is made for example of $Ga_{0.5}In_{0.5}P$ of carrier concentration of $1*10^{18}$ cm$^{-3}$ of 0.01 micrometer thickness. The p-type confinement layer 206 is made for example of $Al_{0.5}In_{0.5}P$ of carrier concentration of $4*10^{17}$ cm$^{-3}$ of 0.3 micrometer. The p-type blocking layer 207 is made for example of GaAs of carrier concentration of $1*10^{18}$ cm$^{-3}$ of 0.5 micrometer thickness. The p-type upper cladding layer 209 is made for example of $Al_yGa_{1-y}As$ of $0<y<1$, preferably y=0.7 of carrier concentration $1*10^{18}$ cm$^{-3}$ of 0.5 micrometer thickness. The p-type cap layer 210 is made for example of GaAs of carrier concentration of $5*10^{18}$ cm$^{-3}$ of 3 micrometer thickness. The p-type ohmic contact electrode 211 is made of Cr/Au, while the n-type ohmic contact electrode 212 is made of Au/Ge/Ni.

A characteristic of this second embodiment is that the disordered layer 220 formed at both sides of the stripe-like opening has a wider band gap and a refractive index lower than that of the p-type $(Al_xGa_{1-x})_{0.5}In_{0.5}P$ cladding layer 202, so that light can be confined and guided in both directions parallel and perpendicular to the active layer 203. Therefore, astigmatism becomes much smaller than that of prior arts. For example, in the above-mentioned example, the astigmatism becomes as small as three micrometers.

Another characteristic is that the disordered layer 220 having a band gap larger than that that of the active layer 203 does not absorb light generated in the active layer 203. Therefore, the loss of light becomes small, and the threshold value of lasing becomes much smaller than that of prior arts. For example, in the above-mentioned embodiment, the threshold value is as small as 20 mA.

A further characteristic is that it is also possible to make the stripe width narrower because the disordered layer 220 does not absorb light. For example, if the stripe width is 2.5 micrometers or less in the above-mentioned embodiment, the light radiation angle $\theta \parallel$ in a direction parallel to the active layer 103 can be increased up to 11° larger than a prior art value 8°, while the light radiation angle $\theta \perp$ in a direction perpendicular to the active layer 103 is 36°, so that the aspect ratio $\theta \perp / \theta \parallel$ can be decreased to 3.3 smaller that a prior art value 4.6, so as to make the shape toward to a circle.

It is to be noted that if the conductivity type of the GaAs blocking layer 207 above the p-type AlInP confinement layer 206 is changed to p-type, the current can also be blocked and can be confined because the discontinuity of bands which exists at the heterojunction between the p-type AlInP confinement layer 206 and the p-type GaAs blocking layer becomes a barrier for holes. Thus, the current can also be narrowed.

Figure 5A:
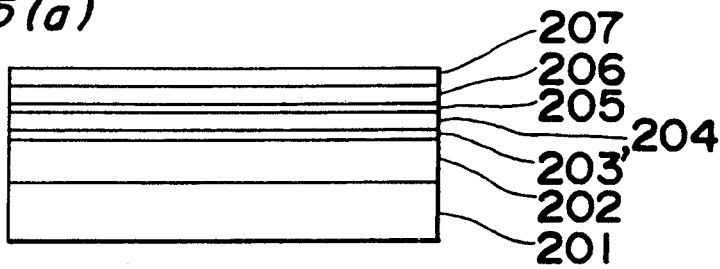
FIGS. 5(a)-(c) schematic views for illustrating steps of a method of manufacturing a semiconductor laser of the second embodiment.
Figure 5B:
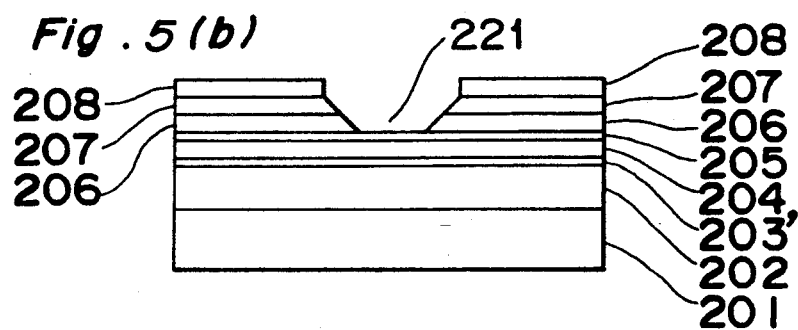
Figure 5C:
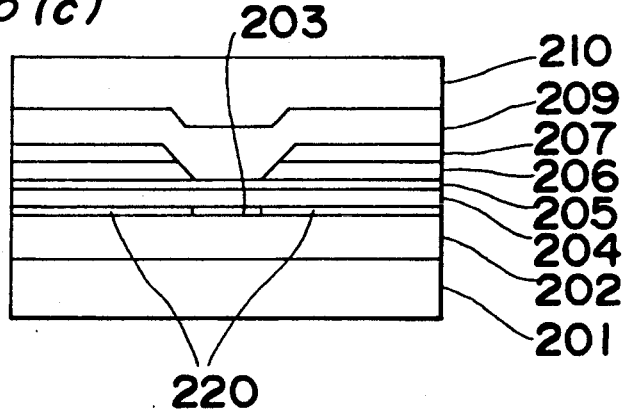

FIGS. 5(a)-(c) and 4 show the steps of a method of manufacturing a semiconductor laser of the second embodiment. First, as shown in FIG. 5(a), following layers 202 to 207 are grown successively on the (100) plane of the p-type GaAs substrate 201 with phase matching with use of MO-VPE process: the n-type first cladding layer 202 of $(Al_xGa_{1-x})_{0.5}In_{0.5}P$ (x=0.6 of carrier concentration of $7*10^{17}$ cm$^{-3}$ of 1 micrometer thickness), the $Ga_{0.5}In_{0.5}P$ active layer 203 (thickness of 0.08 micrometer), the p-type second cladding layer 204 of $(Al_xGa_{1-x})_{0.5}In_{0.5}P$ (x=0.6 of carrier concentration of $4*10^{17}$ cm$^{-3}$ of thickness 0.1 micrometer), the p-type $Ga_{0.5}In_{0.5}P$ etch stop layer 205 (carrier concentration of $1*10^{18}$ cm$^{-3}$ of 0.01 micrometer thickness), the p-type $Al_{0.5}In_{0.5}P$ confinement layer 206 doped with zinc (carrier concentration of $1*10^{18}$ cm$^{-3}$ of 0.3 micrometer), and the n-type GaAs blocking layer 207 (carrier concentration of $1*10^{18}$ cm$^{-3}$ of 0.5 micrometer thickness). Next, after an $SiO_2$ film 208 is applied to the n-type GaAs blocking layer 207, an opening of a stripe of for example three micrometer width is formed for a mask for photolithography. Then, by using the mask, the n-type GaAs blocking layer 207 is etched for example with a mixture solution of $H_2SO_4:H_2O_2:H_2O = 1:1:10$, and further by using a mask of the n-type GaAs blocking layer 207, the p-type AlInP etch stop layer 206 is etched to the p-type $Ga_{0.5}In_{0.5}P$ etch stop layer 204 for example with hot concentrated sulfuric acid at 30° C., thus forming a stripe-like opening 221 as shown in FIG. 5(b). If the stripe is formed for example in <011> direction, the p-type AlInP confinement layer 206 and the n-type GaAs blocking layer 207 are etched with tapering at both sides of the opening 221. Then, as shown in FIG. 5(c), after the $SiO_2$ film 208 is removed, the p-type upper cladding layer 209 of $(Al_yGa_{1-y})_{0.5}In_{0.5}P$ (y=0.7 of carrier concentration $5*10^{17}$ cm$^{-3}$ of 0.5 micrometer thickness) and the p-type GaAs cap layer 210 (carrier concentration of $5*10^{18}$ cm$^{-3}$ of 3 micrometer thickness) are grown successively over the whole surface with the MO-VPE process. Then, as shown in FIG. 5(c), zinc impurities are diffused from the AlInP confinement layer 206 due to the heat added on forming the p-type upper cladding layer 209 and the p-type contact layer 210, so that the $Ga_{0.5}In_{0.5}P$ layer 203′ is disordered below the AlInP confinement layer 206 to form a disordered layer 220, while keeping the layer 203′ in the crystalline state below the opening 221 to form an active layer 203. Finally, the p-type ohmic contact electrode 211 made of Cr/Au is formed on the surface, and after the substrate 201 is thinned with use of polishing and etching, the n-type ohmic contact electrode 212 made of Au/Ge/Ni is formed on the rear surface. Thus, the semiconductor laser shown in FIG. 4 is completed.

In this embodiment, zinc impurities are doped in the confinement layer 206, in order to difuse into the active layer 203 to form disordered layers 220. However, other impurities such as magnesium atoms can also be adopted in order to form the disordered layers 220.

It is an advantage of the above-mentioned manufacturing method of a semiconductor laser that the disordered layers 220 can be formed by disordering the natural super-lattice in the $Ga_{0.5}In_{0.5}P$ layer 203′ caused by impurities diffusing from the AlInP confinement layer 210 with the heat used for forming the p-type upper cladding layer 209 and the p-type contact layer 210 above the stripe-like opening 221 and the AlInP confinement layer 206. Therefore, the processing is simple and the disordered layers 220 can be formed automatically at both sides of the opening 221.

Figure 6:
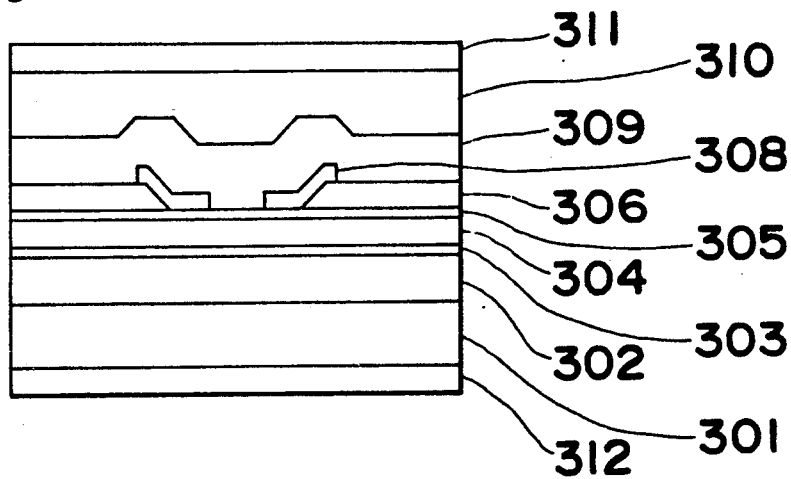
FIG. 6 is a schematic sectional view of a semiconductor laser of a third embodiment.

FIG. 6 shows a schematic sectional view of a semiconductor laser of a third embodiment, wherein an n-type cladding layer 302, an active layer 303, a p-type cladding layer 304 and a p-type etch stop layer 305 are applied successively to an n-type substrate 301. Further, an n-type blocking layer 306 is applied to the etch stop layer 305 with a stripe-like opening 321 for confining current formed through the blocking layer 306, and insulator films 308 are formed at both sides of the stripe-like opening 321 so as to form a stripe-like opening 322 to narrow the current path. Then, a p-type upper cladding layer 309 and a p-type cap layer 310 are applied successively to the blocking layer 306 and the insulator layers 308, and the etch stop layer 305. Further, an electrode 311 is applied to the cap layer 310, while an electrode 312 is applied to the substrate 301.

The substrate 301 is made of n-type GaAs having a (100) principal plane. The n-type cladding layer 302 is made for example of $(Al_xGa_{1-x})_{0.5}In_{0.5}P$ of $0<x<1$, preferably x=0.6 of carrier concentration of $7*10^{17}$ cm$^{-3}$ of 1 micrometer thickness. The active layer 303 is made for example of $Ga_{0.5}In_{0.5}P$ of thickness of for example 0.08 micrometer. The p-type cladding layer 304 is made for example of $(Al_xGa_{1-x})_{0.5}In_{0.5}P$ of x=0.6 of carrier concentration of $4*10^{17}$ cm$^{-3}$ of thickness 0.1 micrometer. The p-type etch stop layer 305 is made for example of $Ga_{0.5}In_{0.5}P$ of carrier concentration of $1*10^{18}$ cm$^{-3}$ of 0.01 micrometer thickness. The n-type blocking layer 306 is made for example of GaAs of carrier concentration of $1*10^{18}$ cm$^{-3}$ of 0.5 micrometer thickness. The insulator layers 308 are made of $SiO_2$. The p-type upper cladding layer 309 is made for example of $Al_yGa_{1-y}As$ of $0<y<1$, preferably y=0.7 of carrier concentration $1*10^{18}$ cm$^{-3}$ of 0.5 micrometer thickness. The p-type cap layer 310 is made for example of GaAs of carrier concentration of $5*10^{18}$ cm$^{-3}$ of 3 micrometer thickness. The p-type ohmic contact electrode 311 is made of Cr/Au, while the n-type ohmic contact electrode 312 is made of Au/Ge/Ni.

A characteristic of this embodiment is that the insulator films 308 of $SiO_2$ having a refractive index lower than that of the p-type $(Al_xGa_{1-x})_{0.5}In_{0.5}P$ cladding layer 304 are formed at both sides of the stripe-like opening 351 to narrow the current path, light can be confined and guided in a direction parallel to the active layer 103, so that light can be guided according to refractive index in both directions parallel and vertical to the active layer 103. Therefore, astigmatism becomes much smaller than that of prior arts.

Another characteristic is that the $SiO_2$ layers 308 have a very small absorption coefficient of light so that the loss of light becomes smaller and the threshold value of laser action becomes much smaller than that of prior arts. For example, in the above-mentioned third embodiment, the threshold value is as small as 20 mA.

A further characteristic is that it is also possible to narrow the stripe width because the $SiO_2$ layers 308 do not absorb light. For example, if the stripe width is 2 micrometers in the third embodiment, the light radiation angle $\theta \parallel$ in a direction parallel to the active layer 103 can be increased up to 15° larger than a prior art value 8, while the light radiation angle $\theta \perp$ in a direction perpendicular to the active layer 103 is 36°, so that the aspect ratio $\theta \perp / \theta \parallel$ can be decreased to 2.4 smaller that a prior art value 4.6, so as to make the shape toward to a circle.

It is another advantage of the third embodiment that the n-type GaAs blocking layer 306 to absorb light exists outside the $SiO_2$ layers 308 arranged at the two sides of the stripe-like opening 322. That is, as the lateral mode as the distribution of waveguide mode in a plane parallel to the active layer 303 becomes of a higher order, the smearing of light to the two sides of the stripe becomes larger so that the confinement coefficient of light in the inside of the stripe becomes smaller. Therefore, the quantity of light absorbed in the GaAs layer 306 increases with increase in the order of the lateral mode. Thus, the lateral mode of a higher order becomes suppressed or the laser action occurs more in the basic mode, so that a change in the optical output vs. current characteristic due to a jump of mode becomes harder so as to realise a more stable action of the semiconductor laser.

Figure 7A:
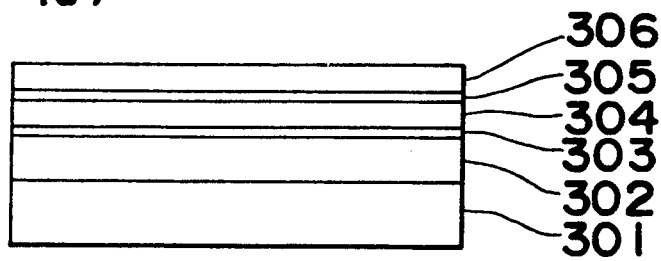
FIGS. 7(a)-(d) are schematic views for illustrating steps of a method of manufacturing a semiconductor laser of the third embodiment.
Figure 7B:
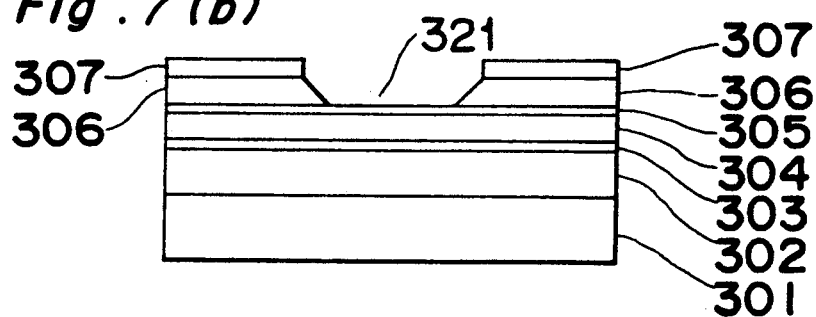
Figure 7C:
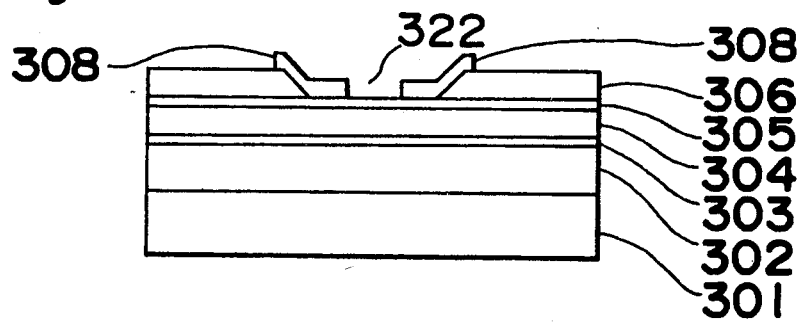
Figure 7D:
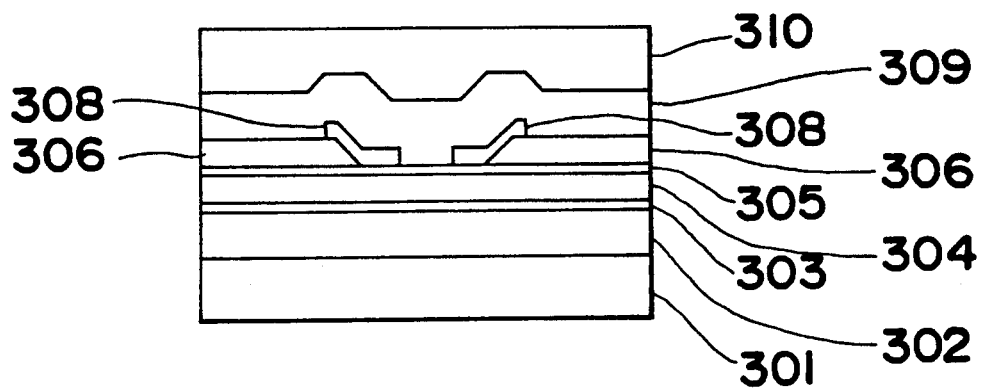

FIGS. 7(a)–(d) and 6 show steps of a method of manufacturing a semiconductor laser of the third embodiment. First, as shown in FIG. 7(a), following layers 302 to 306 are grown successively on the (100) plane of the p-type GaAs substrate 301 with phase match with use of MO-VPE process: the n-type cladding layer 302 of $(Al_xGa_{1-x})_{0.5}In_{0.5}P$ (x=0.6 of carrier concentration of $7*10^{17}$ cm$^{-3}$ of 1 micrometer thickness), the $Ga_{0.5}In_{0.5}P$ active layer 303 (thickness of 0.08 micrometer), the p-type cladding layer 304 of $(Al_xGa_{1-x})_{0.5}In_{0.5}P$ (x=0.6 of carrier concentration of $4*10^{17}$ cm$^{-3}$ of thickness 0.1 micrometer), the p-type $Ga_{0.5}In_{0.5}P$ etch stop layer 305 (carrier concentration of $1*10^{18}$ cm$^{-3}$ of 0.01 micrometer thickness), and the n-type GaAs blocking layer 306 (carrier concentration of $1*10^{18}$ cm$^{-3}$ of 0.5 micrometer thickness). Next, after an SiO$_2$ film 307 is applied to the n-type GaAs blocking layer 306, a stripe-like opening of for example five micrometer width is formed for a mask for photolithography. Then, by using the mask, the n-type GaAs blocking layer 306 is etched for example with a mixture solution of H$_2$SO$_4$:H$_2$O$_2$:H$_2$O=1:1:10 to reach to the p-type $Ga_{0.5}In_{0.5}P$ etch stop layer 304 to form a stripe-like opening 321 in the n-type GaAs blocking layer 306, as shown in FIG. 7(b). If the stripe is formed in <011> direction, the n-type GaAs layer 306 is etched with tapering at both sides of the opening 321. Further, after removing the SiO$_2$ layer 307, another SiO$_2$ film (not shown) is applied to the n-type GaAs blocking layer 306 and the etch stop layer 305, and SiO$_2$ stripe-like films for example of 6 micrometer width are formed with use of photolithography to form an opening 352 of 2 micrometer width as shown in FIG. 7(c). The opening 322 is located at the surface of the p-type $Ga_{0.5}In_{0.5}P$ etch stop layer 304. Then, the p-type $Al_yGa_{1-y}As$ upper cladding layer 309 (y=0.7 of carrier concentration $1*10^{18}$ cm$^{-3}$ of 0.5 micrometer thickness) and the p-type GaAs cap layer 310 (carrier concentration of $5*10^{18}$ cm$^{-3}$ of 3 micrometer thickness) are applied successively over the whole surface with the MO-VPE process as shown in FIG. 7(d). Finally, the p-type ohmic contact electrode 311 made of Cr/Au is formed on the surface, and after thinning the rear surface with polishing and etching, the n-type ohmic contact electrode 312 made of Au/Ge/Ni is formed on the rear surface. Thus, the semiconductor laser of the third embodiment shown in FIG. 6 is completed. In some conditions of crystal growth, the p-type $Al_yGa_{1-y}As$ upper cladding layer 309 or the p-type GaAs cap layer 310 does not grow. However, even in these cases, the laser action of the $(Al_xGa_{1-x})_{0.5}In_{0.5}P$ semiconductor laser of the third embodiment is essentially not affected.

It is an advantage of the above-mentioned manufacturing method of a semiconductor laser that even if the p-type $Al_yGa_{1-y}As$ upper cladding layer 309 does not grow, the laser action of the semiconductor laser does not become bad because the SiO$_2$ films 308 cover from the surface of the p-type $Ga_{0.5}In_{0.5}P$ etch stop layer 305 to the side of the n-type GaAs blocking layer 306.

Though the thermal conductivity of the SiO$_2$ films 308 is lower than that of GaAs, the thickness of the SiO$_2$ films 308 is as thin as about 0.1 micrometer. Further, the SiO$_2$ films 308 are embedded only near the two sides of the stripe-like opening 351, while there exists the n-type GaAs blocking layer 306 at the outer side of the SiO$_2$ films 308 Thus, the heat generated near the active layer 303 is diffused by the n-type GaAs blocking layer 306 or the diffusion of the heat does not become worse due to the existence of the SiO$_2$ layers 308.

The materials for the active layer and the two cladding layers interposing the active layer are required to make phase match as well as the GaAs substrate. In the above-mentioned semiconductor lasers of the first to third embodiments, the active layers are made of $Ga_{0.5}In_{0.5}P$. However, other compound semiconductors can also be used for the active layer, and $(Al_xGa_{1-x})_{0.5}In_{0.5}P$ among them may be used instead of $Ga_{0.5}In_{0.5}P$. It is also possible that the conductivity types of the layers consisting of the semiconductor lasers can be changed between n-type and p-type.

In the first and third embodiments, the p-type $Al_yGa_{1-y}As$ layer is used as the upper cladding layer 109, 309. However, a p-type $(Al_xGa_{1-x})_{0.5}In_{0.5}P$ layer may also be used instead of the $Al_yGa_{1-y}As$ layer.

In the second embodiment, the $(Al_xGa_{1-x})_{0.5}In_{0.5}P$ layer is used as the upper cladding layer 209. However, a p-type $Al_yGa_{1-y}As$ layer may be used instead of the $(Al_xGa_{1-x})_{0.5}In_{0.5}P$ layer.

This invention may be practiced or embodied in still other ways without departing from the spirit or essential characteristic thereof. The preferred embodiments described herein are therefore illustrative and not restrictive, the scope of the invention being indicated by the appended claims and all variations which come within the meaning of the claims are intended to be embraced therein.

What is claimed is:

1. A semiconductor laser, comprising:
   A GaAs substrate of a first conductivity type;
   a first $(Al_xGa_{1-x})_{0.5}In_{0.5}P$ cladding layer of the first conductivity type applied to said GaAs substrate;
   an active layer applied to said $(Al_xGa_{1-x})_{0.5}In_{0.5}P$ cladding layer;
   a second $(Al_xGa_{1-x})_{0.5}In_{0.5}P$ cladding layer of a second conductivity type different from that of the first conductivity type, said second cladding layer being applied to said active layer;
   a confinement layer having a stripe-like opening, which confinement layer has a refractive index lower than that of said second $(Al_xGa_{1-x})_{0.5}In_{0.5}P$ cladding layer. said confinement layer being applied to said second $(Al_xGa_{1-x})_{0.5}In_{0.5}P$ cladding layer; and
   an upper cladding layer of second conductivity type, which upper cladding layer has a band gap larger than that of said second cladding layer, and a refractive index lower than that of said second cladding layer, and which upper cladding layer has a refractive index higher than that of said confinement layer, said upper cladding layer being applied to said confinement layer and said second $(Al_xGa_{1-x})_{0.5}In_{0.5}P$ cladding layer.

2. A semiconductor laser according to claim 1, wherein said active layer is made of $Ga_{0.5}In_{0.5}P$.

3. A semiconductor laser according to claim 1, wherein said active layer is made of $(Al_xGa_{1-x})_{0.5}In_{0.5}P$.

4. A semiconductor laser according to 1, wherein said confinement layer is made of $Al_{0.5}In_{0.5}P$.

5. A semiconductor laser according to claim 1, wherein said confinement layer is made of $(Al_xGa_{1-x})_{0.5}In_{0.5}P$.

6. A semiconductor laser according to claim 1, wherein said upper cladding layer is made of $Al_yGa_{1-y}As$.

7. A semiconductor laser according to claim 1, wherein said upper cladding layer is made of $(Al_xGa_{1-x})_{0.5}In_{0.5}P$.

8. A semiconductor laser according to claim 1, further comprising a blocking layer of the first conductivity type interposed between said confinement layer and said upper cladding layer.

9. A method of manufacturing a semiconductor laser, comprising the steps of:

applying a first cladding layer of $(Al_xGa_{1-x})_{0.5}In_{0.5}P$ of a first conductivity type, an active layer, a second cladding layer of $(Al_xGa_{1-x})_{0.5}In_{0.5}P$ of a second conductivity type different from the first conductivity type, and a confinement layer of $Al_{0.5}In_{0.5}P$ successively on a substrate of GaAs of the first conductivity type;

forming a stripe-like opening in said confinement layer;

applying an upper cladding layer of the second conductivity type to said confinement layer and said stripe-like opening, which upper cladding layer has a band gap larger than that of said second cladding layer and a refractive index lower than that of said second cladding layer, and which upper cladding layer has a refractive index higher than that of said confinement layer;

applying a first contact layer to said upper cladding layer; and applying a second contact layer to said substrate.

10. A semiconductor laser, comprising:
a GaAs substrate of a first conductivity type;
a first $(Al_xGa_{1-x})_{0.5}In_{0.5}P$ cladding layer of the first conductivity type applied to said GaAs substrate;
an active layer applied to said $(Al_xGa_{1-x})_{0.5}In_{0.5}P$ cladding layer;
a second $(Al_xGa_{1-x})_{0.5}In_{0.5}P$ cladding layer of a second conductivity type different from that of the first conductivity type, said second cladding layer being applied to said active layer;
a confinement layer having a stripe-like opening, which confinement layer has a refractive index lower than that of said second $(Al_xGa_{1-x})_{0.5}In_{0.5}P$ cladding layer, said confinement layer being applied to said second $(Al_xGa_{1-x})_{0.5}In_{0.5}P$ cladding layer.
two insulator layers having a refractive index lower than that of said second cladding layer, said insulator layers being applied to said second cladding layer and said confinement layer, said two insulator layers being arranged to form a stripe-like gap; and
an upper cladding layer of the second conductivity type, which upper cladding layer has a band gap larger than that of said second cladding layer and a refractive index lower than that of said second cladding layer, said upper cladding layer being applied to said confinement layer, said insulating layers and said second $(Al_xGa_{1-x})_{0.5}In_{0.5}P$ cladding layer.

11. A semiconductor laser according to claim 10, wherein said active layer is made of $Ga_{0.5}In_{0.5}P$.

12. A semiconductor laser according to claim 10, wherein said active layer is made of $(Al_xGa_{1-x})_{0.5}In_{0.5}P$.

13. A semiconductor laser according to claim 10, wherein said insulators layer are made of $SiO_2$.

14. A semiconductor laser according to claim 10, wherein said upper cladding layer is made of $Al_yGa_{1-y}As$.

15. A semiconductor laser according to claim 10, wherein said upper cladding layer is made of $(Al_xGa_{1-x})_{0.5}In_{0.5}P$.

16. A semiconductor laser according to claim 10, further comprising a blocking layer of the first conductivity type interposed between said confinement layer and said upper cladding layer.

17. A method of manufacturing a semiconductor laser, comprising the steps of:

applying a first cladding layer of $(Al_xGa_{1-x})_{0.5}In_{0.5}P$ of a first conductivity type, an active layer, a second cladding layer of $(Al_xGa_{1-x})_{0.5}In_{0.5}P$ of a second conductivity type different from the first conductivity type, and a confinement layer of $Al_{0.5}In_{0.5}P$ successively on a substrate of GaAs of the first conductivity type;

forming a stripe-like opening in said confinement layer;

forming two insulator layers on said second cladding layer and said confinement layer around the two edges of the stripe-like opening in said confinement layer;

applying an upper cladding layer of the second conductivity type to said confinement layer and said stripe-like opening, which upper cladding layer has a band gap larger than that of said second cladding layer and has a refractive index lower than that of said second cladding layer; and applying a contact layer of the second conductivity type to said upper cladding layer.

18. A semiconductor laser, comprising:
a GaAs substrate of a first conductivity type;
a first $(Al_xGa_{1-x})_{0.5}In_{0.5}P$ cladding layer of the first conductivity type applied to said GaAs substrate;
a stripe-like active layer applied to said $(Al_xGa_{1-x})_{0.5}In_{0.5}P$ cladding layer;
a disordered layer applied to said $(Al_xGa_{1-x})_{0.5}In_{0.5}P$ cladding layer arranged adjacent to said stripe-like active layer;
a second $(Al_xGa_{1-x})_{0.5}In_{0.5}P$ cladding layer of a second conductivity type different from that of said first $(Al_xGa_{1-x})_{0.5}In_{0.5}P$ cladding layer, said second $(Al_xGa_{1-x})_{0.5}In_{0.5}P$ cladding layer being applied to said stripe-like active layer and said disordered layer;
a confinement layer having a stripe-like opening, which confinement layer has a refractive index lower than that of said second $(Al_xGa_{1-x})_{0.5}In_{0.5}P$ cladding layer; and
an upper cladding layer of the second conductivity type, which upper cladding layer has a band gap larger than that of said second cladding layer and a refractive index lower that that of said second cladding layer.

19. A semiconductor laser according to claim 18, wherein said active layer is made of $Ga_{0.5}In_{0.5}P$.

20. A semiconductor laser according to claim 18, wherein said active layer is made of $(Al_xGa_{1-x})_{0.5}In_{0.5}P$.

21. A semiconductor laser according to claim 18, wherein said confinement layer is made of $Al_{0.5}In_{0.5}P$.

22. A semiconductor laser according to claim 18, wherein said confinement layer is made of $(Al_xGa_{1-x})_{0.5}In_{0.5}P$.

23. A method of manufacturing a semiconductor laser, comprising the steps of:

applying a first cladding layer of $(Al_xGa_{1-x})_{0.5}In_{0.5}P$ of a first conductivity type, an active layer, a second cladding layer of $(Al_xGa_{1-x})_{0.5}In_{0.5}P$ of a second conductivity type different from the first conductivity type, and a confinement layer of AlInP including impurities successively on a substrate of GaAs of the first conductivity type;

forming a stripe-like opening in said confinement layer;

applying an upper cladding layer of the second conductivity type to said confinement layer and said stripe-like opening, which upper cladding layer has a band gap larger than that of said second cladding layer and refractive index lower than that of said second cladding layer; and applying a contact layer of the second conductivity type to said upper cladding layer;

whereby the impurities are diffused from said confinement layer into said active layer to form disordered portions below said confinement layer to remain a stripe-like active layer between the disordered portions.

24. A method according to claim 23, wherein said impurities include zinc atoms.

* * * * *